(12) United States Patent
Fischer et al.

(10) Patent No.: US 6,309,973 B1
(45) Date of Patent: Oct. 30, 2001

(54) SEMICONDUCTOR PROCESSING METHODS OF FORMING A CONDUCTIVE PROJECTION AND METHODS OF INCREASING ALIGNMENT TOLERANCES

(75) Inventors: Mark Fischer; John K. Zahurak; Thomas M. Graettinger; Kunal Parekh, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/507,193

(22) Filed: Feb. 18, 2000

Related U.S. Application Data (63) Continuation of application No. 09/032,254, filed on Feb. 27, 1998, now Pat. No. 6,083,803.

(51) Int. Cl.[7] .................................................. H01L 21/302
(52) U.S. Cl. .......................... 438/691; 438/706; 438/713; 438/719; 438/723
(58) Field of Search .................................... 438/386, 387, 438/388, 390, 393, 394, 395, 396, 713, 719, 723

(56) References Cited

U.S. PATENT DOCUMENTS

| | | | |
|---|---|---|---|
| 4,436,581 | 3/1984 | Okudaira et al. | 438/720 |
| 4,438,556 | 3/1984 | Komatsu et al. | 438/735 |
| 4,957,881 | 9/1990 | Crotti | 438/631 |
| 5,362,666 | 11/1994 | Dennison | 438/396 |
| 5,397,433 | 3/1995 | Gabriel | 438/713 |
| 5,416,048 | 5/1995 | Blalock et al. | 438/695 |
| 5,506,166 | * 4/1996 | Sandhu et al. | 438/396 |
| 5,509,995 | 4/1996 | Park | 438/713 |
| 5,545,581 | * 8/1996 | Armacost et al. | 438/631 |
| 5,597,756 | * 1/1997 | Fazan et al. | 438/398 |
| 5,668,413 | 9/1997 | Nanjo | 257/774 |
| 5,702,979 | 12/1997 | Chan et al. | 428/612 |
| 5,759,892 | 6/1998 | Wang et al. | 438/397 |
| 5,760,474 | 6/1998 | Schuele | 438/396 |
| 5,811,353 | 9/1998 | Chan et al. | 437/192 |
| 5,852,328 | 12/1998 | Nishimura et al. | 257/774 |
| 5,894,160 | 4/1999 | Chan et al. | 257/412 |
| 6,046,093 | * 4/2000 | DeBoer et al. | 438/398 |

FOREIGN PATENT DOCUMENTS

| | | | |
|---|---|---|---|
| 0 365 493 A | 4/1990 | (EP) | H01L/21/60 |
| 0 788 160 A | 8/1997 | (EP) | H01L/21/60 |
| 07 283319 A | 10/1995 | (JP) . | |

* cited by examiner

*Primary Examiner*—Benjamin L. Utech
*Assistant Examiner*—Duy-Vu Deo
(74) *Attorney, Agent, or Firm*—Wells, St. John, Roberts, Gregory & Matkin (57) ABSTRACT

Semiconductor processing methods of forming conductive projections and methods of increasing alignment tolerances are described. In one implementation, a conductive projection is formed over a substrate surface area and includes an upper surface and a side surface joined therewith to define a corner region. The corner region of the conductive projection is subsequently beveled to increase an alignment tolerance relative thereto. In another implementation, a conductive plug is formed over a substrate node location between a pair of conductive lines and has an uppermost surface. Material of the conductive plug is unevenly removed to define a second uppermost surface, at least a, portion of which is disposed elevationally higher than a conductive line. In one aspect, conductive plug material can be removed by facet etching the conductive plug. In another aspect, conductive plug material is unevenly doped with dopant, and conductive plug material containing greater concentrations of dopant is etched at a greater rate than plug material containing lower concentrations of dopant.

34 Claims, 9 Drawing Sheets

_Fig 7_

_Fig 8_

_Fig 9_

_Fig 10_

SEMICONDUCTOR PROCESSING METHODS OF FORMING A CONDUCTIVE PROJECTION AND METHODS OF INCREASING ALIGNMENT TOLERANCES

RELATED PATENT DATA

This patent resulted from a continuation application of U.S. patent application Ser. No. 09/032,254, filed Feb. 27, 1998, naming Mark Fischer, John K. Zahurak, Thomas M. Graettinger, and Kunal R. Parekh as inventors, and which is now U.S. Pat. No. 6,083,803 the disclosure of which is incorporated by reference.

TECHNICAL FIELD

This invention relates to semiconductor processing methods of forming conductive projections, and to methods of increasing alignment tolerances.

BACKGROUND OF THE INVENTION

As dimensions of semiconductor devices continue to shrink, alignment of individual device components, and compensation for misalignment become increasingly important. Problems associated with feature misalignment can cause shorting and other catastrophic device failure.

In forming semiconductor devices, it is not uncommon to use a conductive projection of material such as a conductive plug to form an intermediate electrical connection between a substrate node location and a device component. An exemplary conductive projection is shown in FIGS. 1–3.

Figure 1:
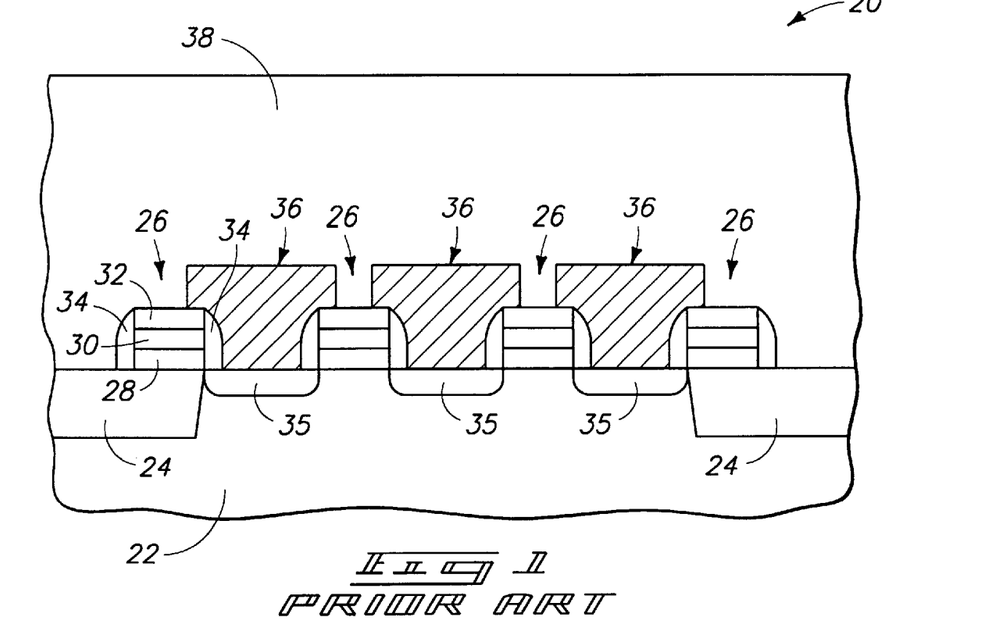
FIG. 1 is a diagrammatic sectional view of a semiconductor wafer fragment in process in accordance with prior art methods.

Referring to FIG. 1, a semiconductor wafer fragment is shown generally at 20 and comprises a semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of isolation oxide regions 24 are formed over substrate 22. A plurality of conductive lines 26 are provided and typically include a polysilicon layer 28, a silicide layer 30 and an insulative cap 32. Sidewall spacers 34 are provided over conductive and non-conductive portions of line 26. Diffusion regions 35 are provided and constitute node locations with which electrical communication is desired. Wafer fragment 20 comprises a portion of a dynamic random access memory (DRAM) device. Conductive projections 36 are provided. A centermost of the conductive projections 36 is positioned to establish electrical communication between diffused regions and a bit line yet to be formed. The conductive projections are typically formed within an opening in an insulative oxide layer such as borophosphosilicate glass (BPSG), and subsequently planarized. A layer 38 is formed over substrate 22 and comprises an insulative material such as BPSG.

Figure 2:
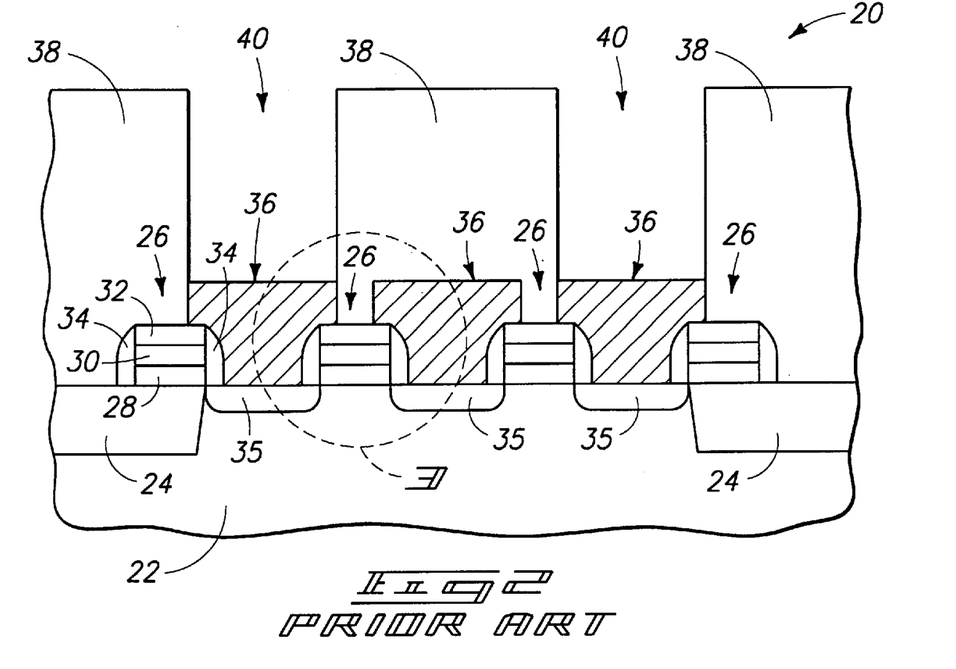
FIG. 2 is a view of the FIG. 1 wafer fragment at a processing step subsequent to that shown in FIG. 1.
Figure 3:
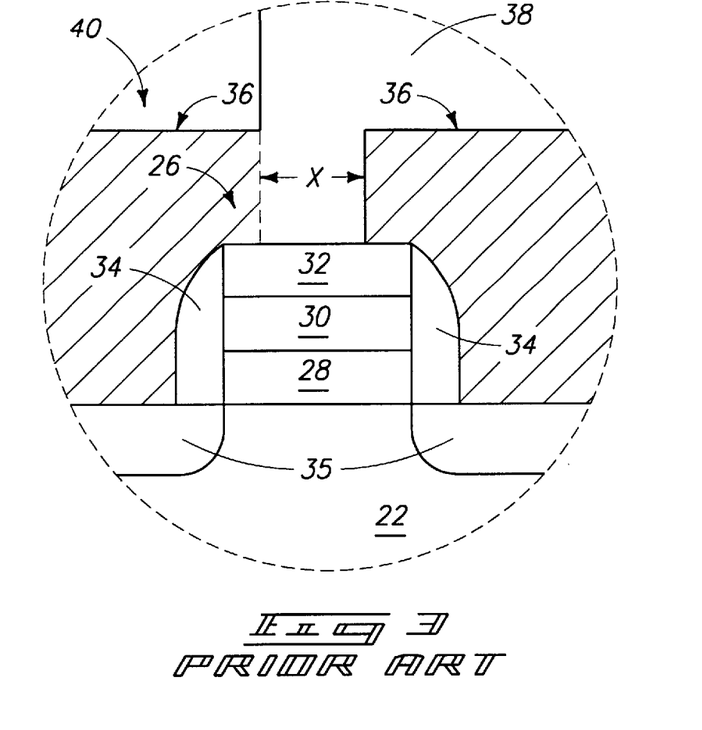
FIG. 3 is an enlarged view of a portion of FIG. 2.

Referring to FIG. 2, a pair of contact openings 40 are formed through layer 38 and outwardly expose the illustrated projections 36. Contact openings 40 constitute openings within which storage capacitors are to be formed. Such capacitors are typically formed by providing a layer of conductive material within opening 40 and over layer 38, and subsequently depositing a capacitor dielectric layer and cell plate layer thereover.

Referring to FIG. 3, an enlarged portion of FIG. 2 shows an example alignment tolerance X between centermost conductive projection 36 and a dashed extension of the right edge of one opening 40. A misalignment of the mask used to form contact opening 40 which is greater than X, and in the direction of the conductive projection, can result in overlap of contact opening 40 and centermost conductive projection 36. Such would subsequently cause conductive capacitor material provided into contact opening 40 to be shorted with centermost conductive projection 36 thereby rendering this; portion of the device inoperative.

This invention arose out of concerns associated with increasing alignment tolerances between conductive projections and electrical is components formed over a semiconductor wafer. The artisan will appreciate other applicability, with the invention only being limited by the accompanying claims appropriately interpreted in accordance with the doctrine of equivalents.

SUMMARY OF THE INVENTION

Semiconductor processing methods of forming conductive projections and methods of increasing alignment tolerances are described. In one implementation, a conductive projection is formed over a substrate surface area and includes an upper surface and a side surface joined therewith to define a corner region. The corner region of the conductive projection is subsequently beveled to increase an alignment tolerance relative thereto. In another implementation, a conductive plug is formed over a substrate node location between a pair of conductive lines and has an uppermost surface. Material of the conductive plug is unevenly removed to define a second uppermost surface, at least a portion of which is disposed elevationally higher than a conductive line. In one aspect, conductive plug material can be removed by facet etching the conductive plug. In another aspect, conductive plug material is unevenly doped with do ad conductive plug material containing greater concentrations of dopant is etched at a greater rate than plug material containing lower concentrations of dopant.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
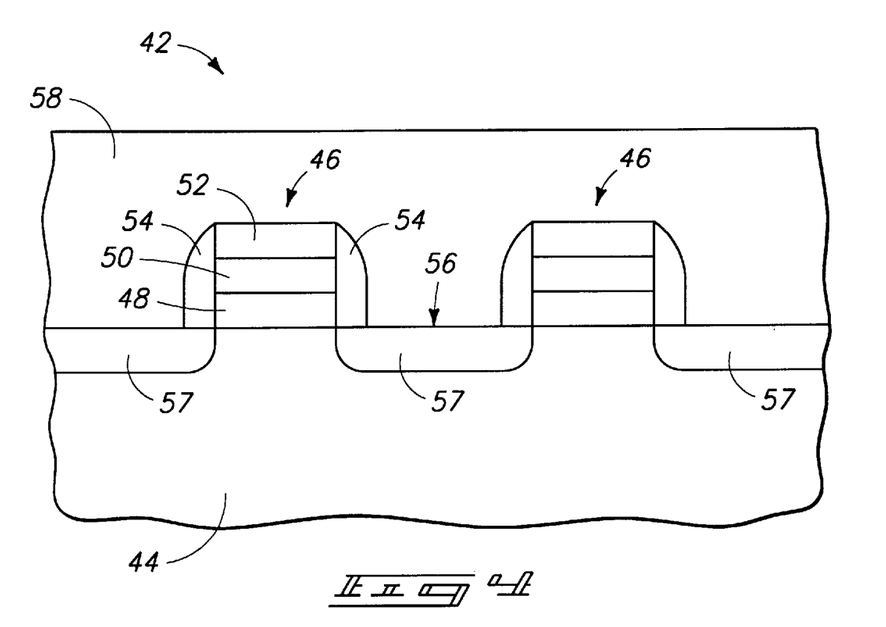
FIG. 4 is a view of a semiconductor wafer fragment in process in accordance with one embodiment of the invention.

Referring to FIG. 4, a semiconductor wafer fragment in process irk accordance with one embodiment of the invention is shown generally at 42 and comprises a semiconductive substrate 44. A pair of conductive lines 46 are formed over substrate 44 and comprise at polysilicon layer 48, a silicide layer 50 and an insulative cap 52. Sidewal spacers 54 are provided over conductive and non-conductive portions of lines 46. Lines 46 constitute a pair of spaced-apart, insulated conductive lines which define a node location 56 or surface area therebetween with which electrical communication is desired. In the illustrated and preferred embodiment, node location 56 comprises a is diffusion region 57 to be connected with a bit line. Other node locations are defined by diffusion regions 57 laterally outward of node location 56, and comprise locations with which electrical communication with storage capacitors is desired, as will become apparent below. A first insulative layer 58 is formed over node location 56 and between the conductive lines. An exemplary material for layer 58 is BPSG.

Figure 5:
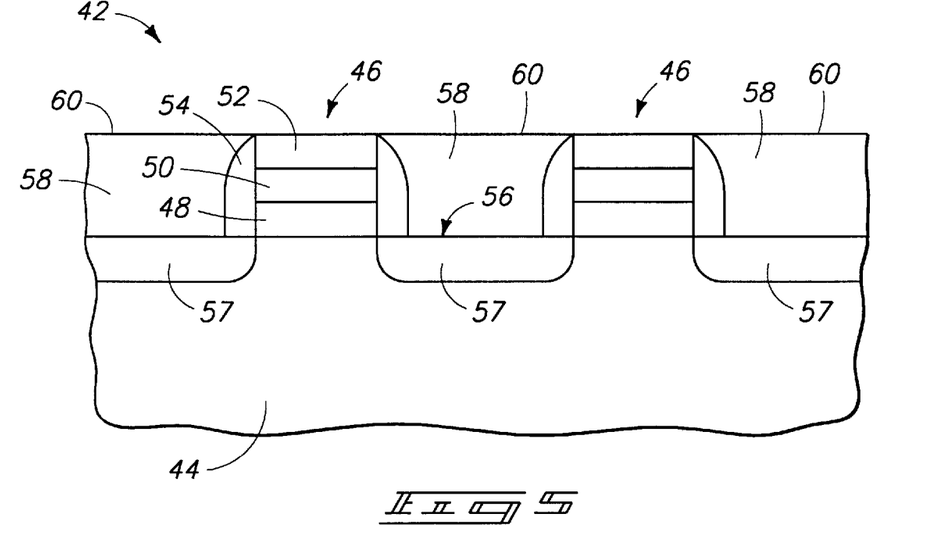
FIG. 5 is a view of the FIG. 4 wafer fragment at a processing step subsequent to that shown in FIG. 4.

Referring to FIG. 5, layer 58 is planarized as by chemical mechanical polishing to provide a generally planar upper surface 60. The planarization of layer 58 can be made to stop on or over the insulative caps of the conductive lines.

Figure 6:
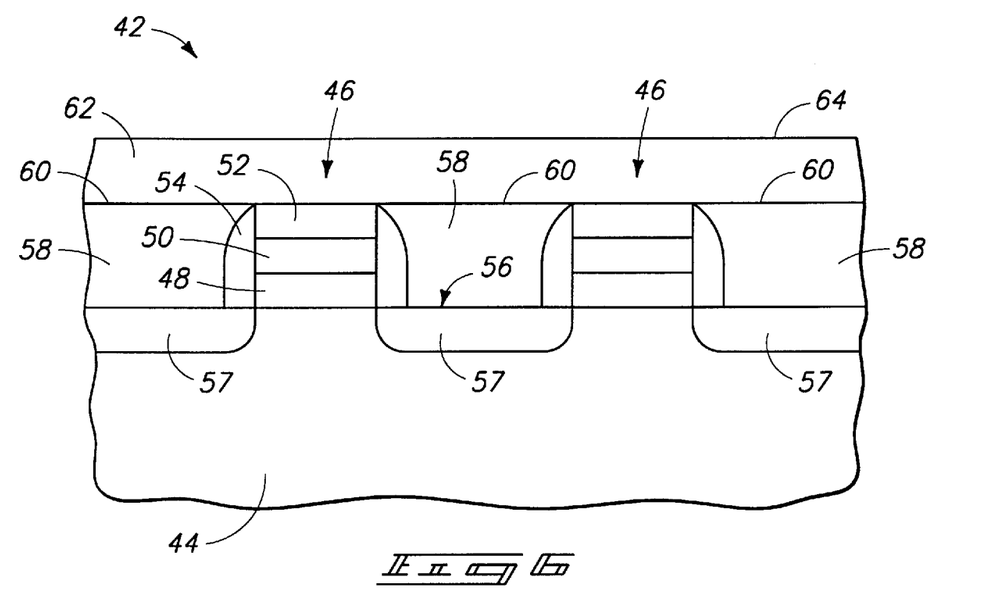
FIG. 6 is a view of the FIG. 4 wafer fragment at a processing step subsequent to that shown in FIG. 5.

Referring to FIG. 6, a second layer of insulative material 62 is formed over node location 56 and has a generally planar upper surface 64.

Figure 7:
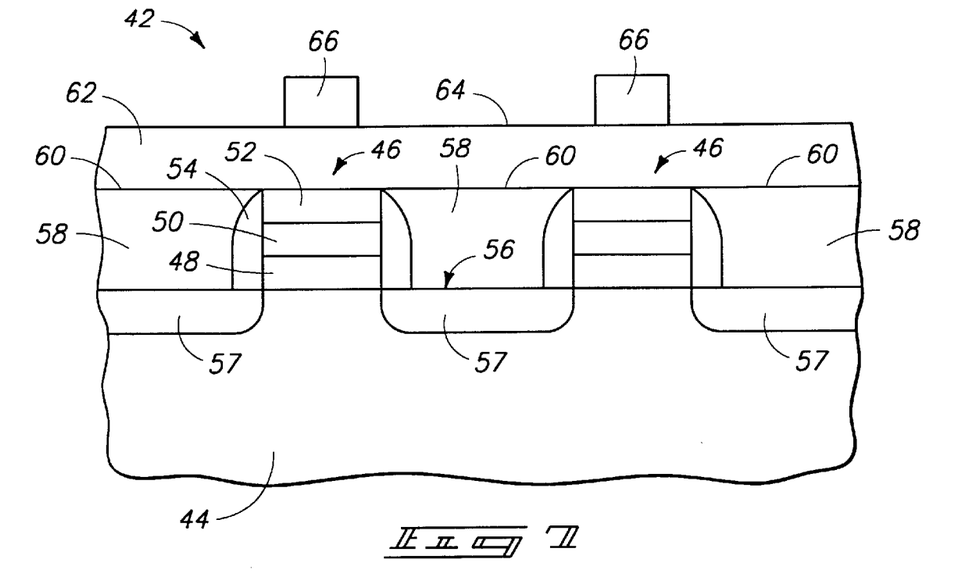
FIG. 7 is a view of the FIG. 4 wafer fragment at a processing step subsequent to that shown in FIG. 6.

Referring to FIG. 7, a patterned masking layer 66 is formed over substrate 44.

Figure 8:
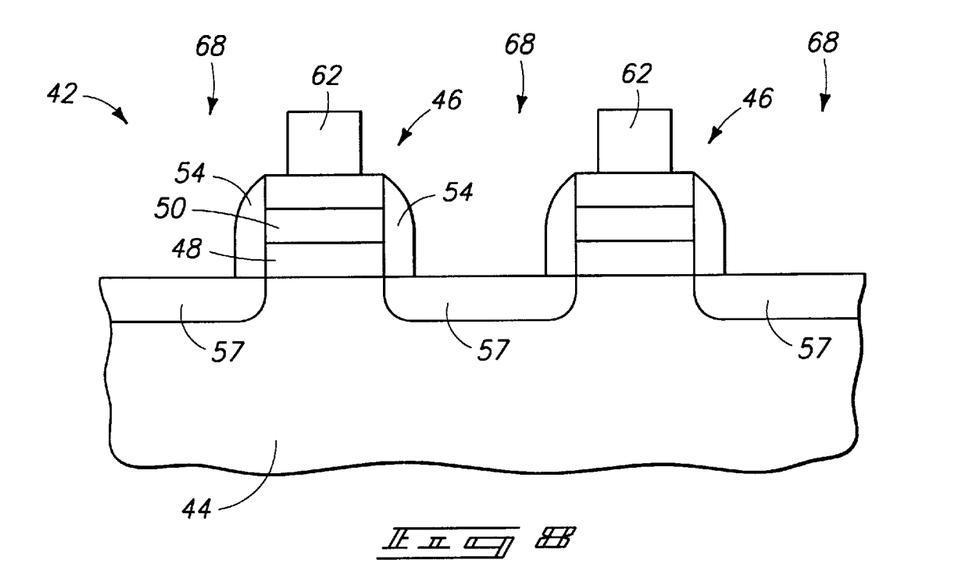
FIG. 8 is a view of the FIG. 4 wafer fragment at a processing a step subsequent to that shown in FIG. 7.

Referring to FIG. 8, openings 68 are formed through material of both first and second layers 58, 62 to proximate the node locations. Preferably, the openings are sufficient to expose the node locations over which each is formed.

Figure 9:
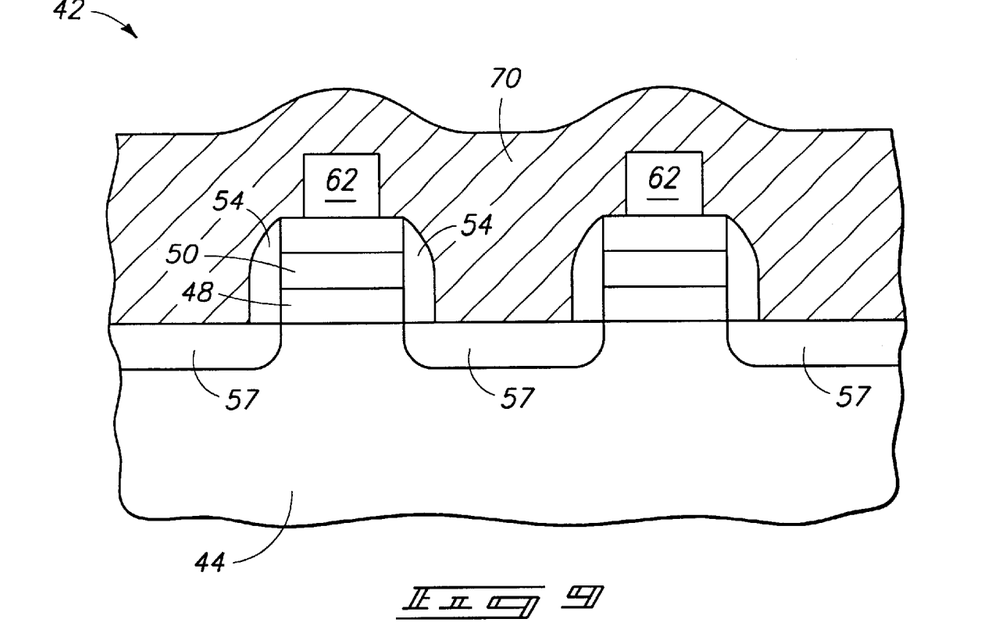
FIG. 9 is a view of the FIG. 4 wafer fragment at a processing step subsequent to that shown in FIG. 8.

Referring to FIG. 9, conductive material 70 is formed over the substrate, insulative material 62, and within openings 68. The opening; are preferably filled with conductive material. An exemplary conductive material is polysilicon.

Figure 10:
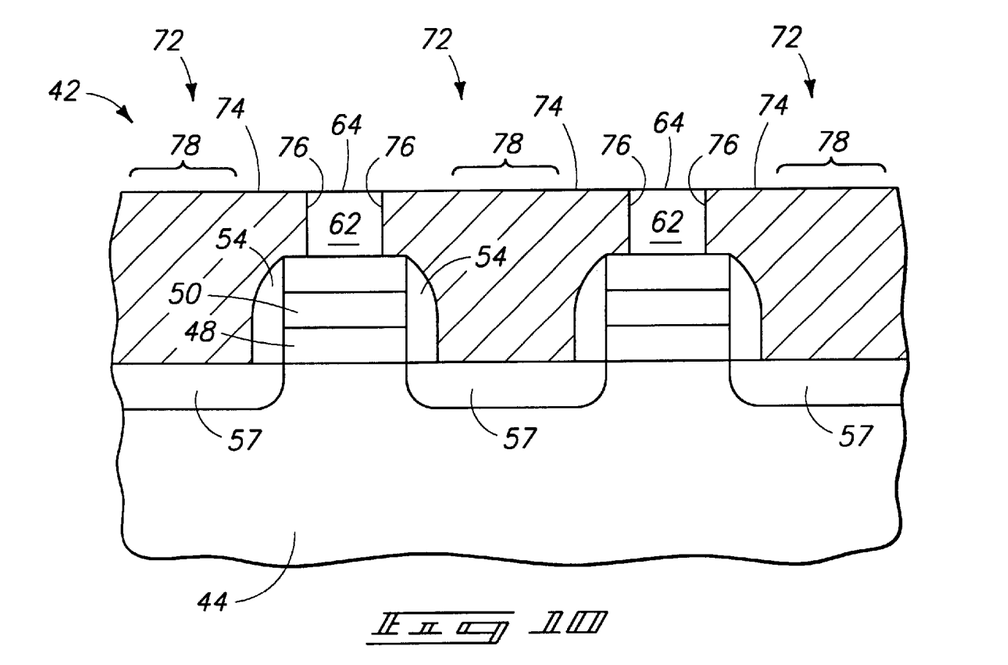
FIG. 10 is a view of the FIG. 4 wafer fragment at a processing step subsequent to that shown in FIG. 9.

Referring to FIG. 10, conductive material 70 is planarized relative to insulative layer upper surface 64. Such isolates conductive material within openings 68 and provides planarized conductive projections 72 over the substrate. In the illustrated and preferred embodiment, conductive projections 72 constitute conductive plugs which are formed in connection with formation of DRAM circuitry. Individual conductive projections 72 include respective upper or uppermost surfaces 74 which joined with respective side surfaces 76. The side surfaces project away from the node location over which each is formed and terminate proximate the respective surface 74 with which it joins. Joinder between upper and side surfaces 74, 76 defines corner regions of the individual conductive projections. Intermediate and away from the corner regions of each projection is a central region 78.

Preferably and as shown, the individual conductive plugs project away from the respective node locations over which each is formed a distance which is further than a distance that one of the conductive lines projects away from the node location. Accordingly, each plug's uppermost surface is disposed elevationally over both conductive lines and is substantially coplanar with the generally planar portion of insulative material 62.

Figure 11:
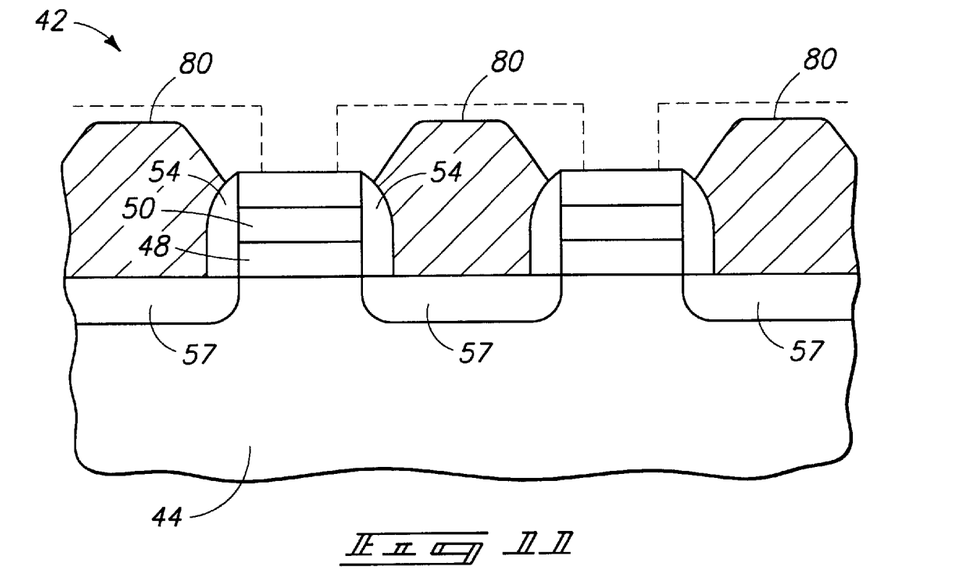
FIG. 11 is a view of the FIG. 4 wafer fragment at a processing step subsequent to that shown in FIG. 10.

Referring to FIG. 11, corner regions of the conductive projections are beveled. In the illustrated example, the beveling of the corner regions comprises facet etching the conductive projection to provide the illustrated beveled construction. Such etching can take place in a cold wall processing chamber using an unheated chuck. Other conditions include a power setting of between 100 W to 600 W, a pressure setting of between 10 to 100 mTorr, and use of Argon ions preferably having incident angles of between 45° to 60°. The insulative material can be removed prior to the facet etching. Alternately, the insulative material can remain during the facet etching.

The facet etching of the conductive projection constitutes unevenly removing the conductive material sufficient to define a second uppermost surface 80, at least of portion of which is disposed elevationally higher than the conductive lines. In this example, more material is removed, from the corner region than from the central region of each plug, and second uppermost surface 80 is generally non-planar.

Figure 12:
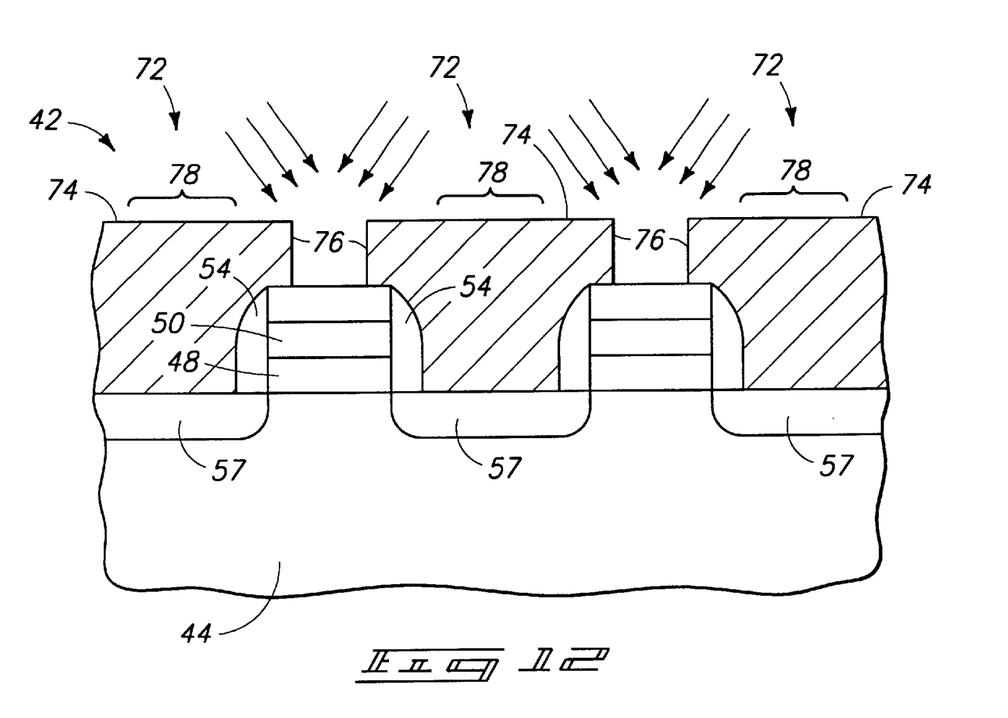
FIG. 12 is a view of the FIG. 10 wafer fragment at a processing step in accordance with another embodiment of the invention.

Referring to FIG. 12, a second embodiment is shown, with the discussion proceeding with processing subsequent to the FIG. 10 wafer fragment. In this example, the conductive projections are unevenly doped proximate the upper and side surfaces. Such uneven doping can be accomplished using an angled ion implant at energies between about 20 keV to 1000 keV, and angles greater than 0° and less than about 60°. The angled ion implant subjects the corner regions to a greater degree of normal angle implanting such that greater implanting occurs relative to the corner regions as opposed to the upper surfaces. As a result, outermost side portions, e.g. the corner regions, of the conductive plug have greater concentrations of dopant than plug material therebetween proximate the central region. Insulative material 62 (FIG. 10) can be removed prior to doping the conductive plugs, or remain during the doping.

Figure 13:
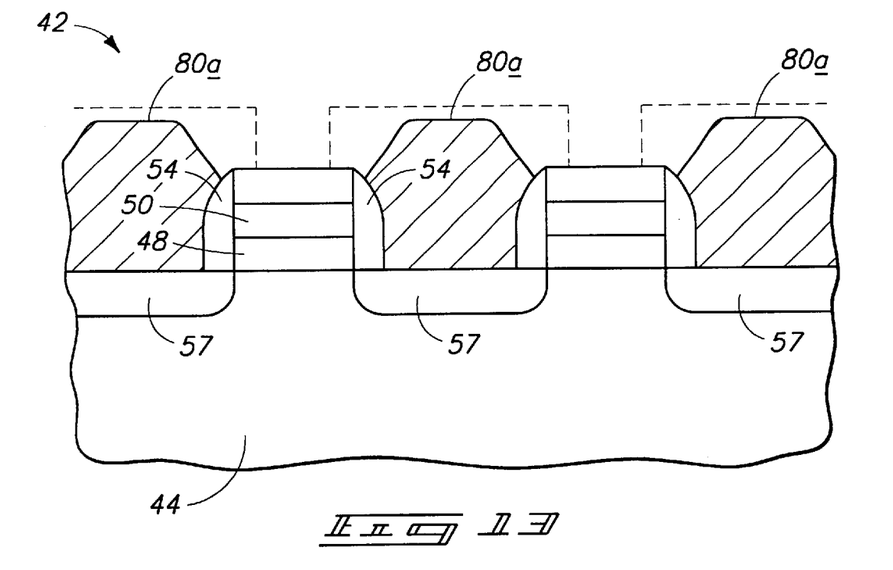
FIG. 13 is a view of the FIG. 12 wafer fragment at a processing step subsequent to that shown in FIG. 12.

Referring to FIG. 13, the individual conductive plugs have been beveled. Such can be accomplished by etching material of the conductive plugs or projections containing greater concentrations of dopant at a greater rate than material of the conductive projections containing lower concentrations of dopant. Insulative material 62 (FIG. 10) can be removed prior to the etching of the conductive plugs or remain during the etching. The beveling of the conductive plugs comprises unevenly removing material of the conductive plug to define a second uppermost surface 80a, at least a portion of which is disposed elevationally higher than the conductive lines. Exemplary etching can comprise dry or wet etching of the plug material. In the former, $Cl_2$ or HBr chemistries can be used to sufficiently activate etching of the corner regions. In the latter, wet etches with a sufficiently high pH can be used. Examples include TMAH or SCI (APM).

Figure 14:
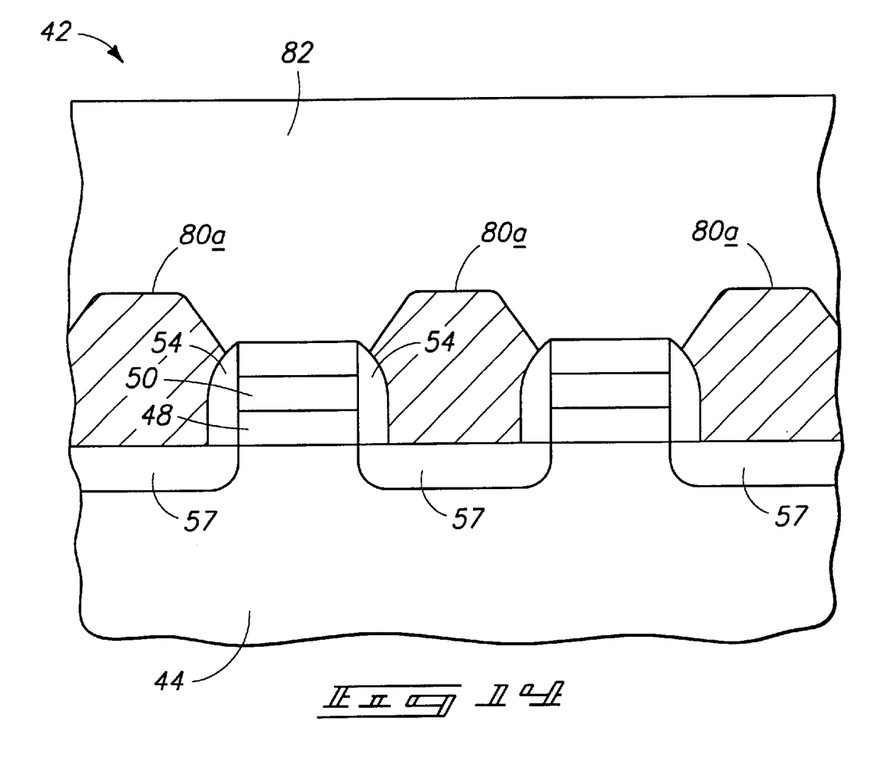
FIG. 14 is a view of either of the FIGS. 11 or 13 wafer fragments, at a processing step subsequent to that shown in either of the respective figures.

Referring to FIG. 14, a layer of material 82 is formed over the substrate, with BPSG being but one example.

Figure 15:
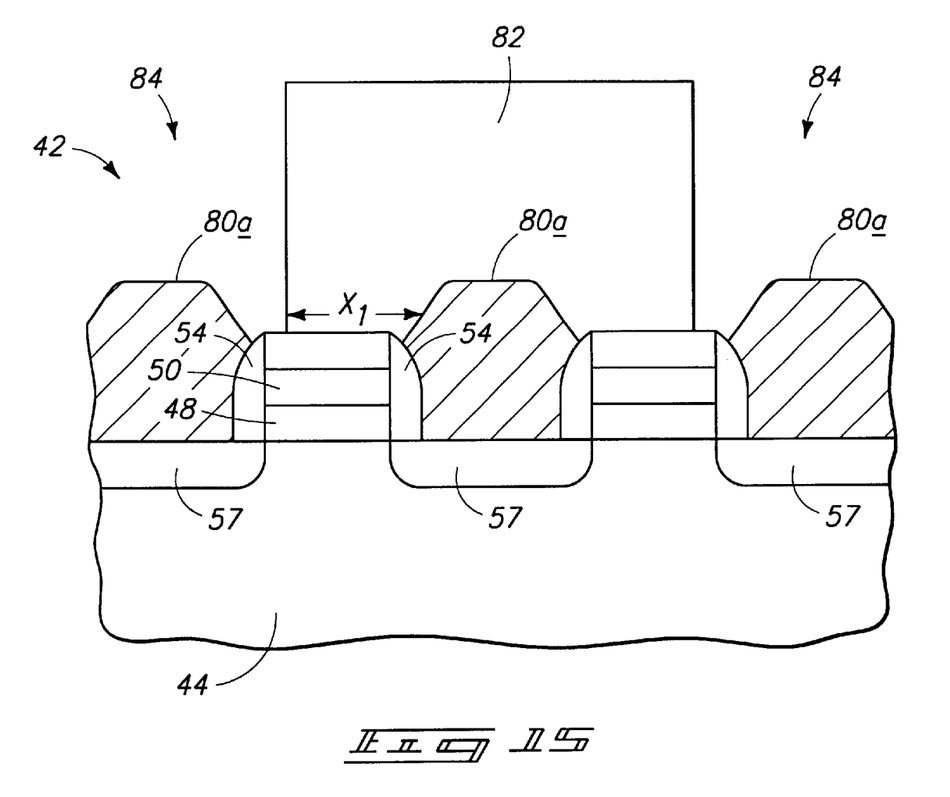
FIG. 15 is a view of the FIG. 14 wafer fragment at a processing step subsequent to that shown in FIG. 14.

Referring to FIG. 15, openings 84 are formed over the substrate and define a second alignment tolerance $X_1$ which is greater than the first alignment tolerance X (FIG. 3).

Figure 16:
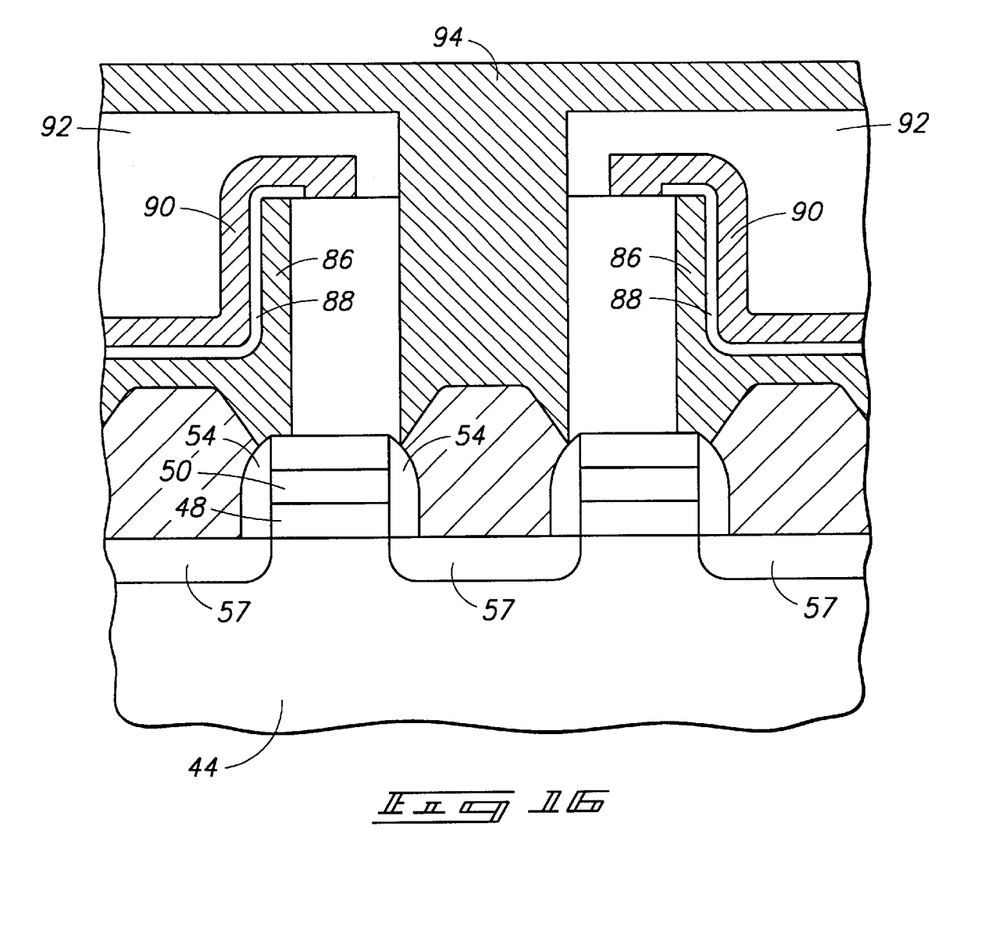
FIG. 16 is a view of the FIG. 14 wafer fragment at a processing step subsequent to that shown in FIG. 15.

Referring to FIG. 16, conductive material 86 has been formed over, and is in electrical communication with the leftmost and rightmost conductive plugs and the respective diffusion regions over which the plugs are formed. Conductive material 86 constitutes respective storage node layers. Dielectric layers 88 are formed over the respective storage node layers 86, and a cell plate layer 90 is formed over the respective dielectric layers. Conductive material 94 is formed over, and is in electrical communication with the centermost conductive plug and the diffusion region over which it is formed. Conductive material 94 comprises a bit line. Here, the alignment tolerance between bit line contact material and adjacent storage capacitors is increased.

Advantages of the above-described methods and structures include that alignment tolerances can be increased with only a slight modification of the processing flow. Process viability can be improved for shifts which may occur in or during photo alignment. Additionally, the above methods allow scaling of contemporary technology to smaller generations of devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed, in any of its forms or modifications within the proper scope of the appended claims appropriately interpreted in accordance with the doctrine of equivalents.

What is claimed is:

1. A semiconductor processing method of forming a conductive projection comprising:

forming a pair of spaced-apart, insulated conductive lines over a substrate, the conductive lines defining a node location therebetween with which electrical communication is desired;

forming insulative material over the node location and between the conductive lines;

forming an opening through the insulative material and between the lines to proximate the node location;

forming conductive material within the opening over the node location, the conductive material comprising an outer portion received elevationally outward of the insulated conductive lines, the conductive material having side surfaces which project away from the node location and terminate proximate an upper surface, the side surfaces and upper surface defining at least one corner region, the side surfaces defining a width of the outer portion of the conductive material within the opening; and beveling the corner region effective to reduce the width of the outer portion of the conductive material above the conductive lines and etching at least some of the conductive material away from an entirety of the upper surface.

2. The semiconductor processing method of claim 1, wherein the forming of the insulative material comprises forming first and second layers of insulative material over the node location.

3. The semiconductor processing method of claim 2 further comprising planarizing the first layer of insulative material prior to forming the second layer of insulative material.

4. The semiconductor processing method of claim 2 further comprising removing the first and second layers of insulative material prior to beveling the corner region.

5. The method of claim 1 wherein the insulated conductive lines comprises anisotropically etched spacers, the insulative material being formed over the anisotropically etched spacers.

6. A method of forming DRAM circuitry comprising:

forming a conductive plug over a substrate node location between a pair of conductive lines and with which electrical communication with a bit line is desired, the conductive plug having a first uppermost surface;

unevenly doping material of the conductive plug with dopant proximate the uppermost surface, outermost side portions of the plug having greater concentrations of dopant than plug material therebetween; and unevenly removing material from the first uppermost surface of the conductive plug to define an uneven second uppermost surface at least a portion of which is disposed elevationally higher than the conductive lines and to reduce a width of the conductive plug from what it was prior to said unevenly removing, the unevenly removing comprising etching material of the conductive plug containing greater concentrations of dopant at a greater rate than material of the conductive plug containing lower concentrations of dopant.

7. The method of claim 6, wherein the unevenly doping material of the conductive plug comprises conducting an angled ion implant of the dopant.

8. The method of claim 6, wherein the forming of the conductive plug comprises:

forming insulative material over the node location, the insulative material having a generally planar upper surface;

forming a contact opening through the insulative material and exposing a portion of the node location;

filling the contact opening with conductive material; and planarizing the conductive material relative to the insulative material upper surface.

9. The method of claim 8 further comprising removing the insulative material prior to removing the material of the conductive plug to define the second uppermost surface.

10. The method of claim 9, wherein the removing of material of the conductive plug comprises facet etching the conductive plug.

11. The method of claim 9, wherein the removing of material of the conductive plug comprises:

unevenly doping material of the conductive plug with dopant proximate the uppermost surface, outermost side portions of the plug having greater concentrations of dopant than plug material therebetween; and etching material of the conductive plug containing greater concentrations of dopant at a greater rate than material of the conductive plug containing lower concentrations of dopant.

12. A method of forming DRAM circuitry comprising:

forming a conductive plug over a substrate node location between a pair of conductive lines and with which electrical communication with a bit line is desired, the conductive plug having a first uppermost surface having a generally uniform surface and having a width;

unevenly doping material of the conductive plug with dopant proximate the uppermost surface, outermost side portions of the plug having greater concentrations of dopant than plug material therebetween; and etching material of the conductive plug to define a second uppermost surface which is generally non-planar and at least a portion of which is disposed elevationally higher than the conductive lines and to reduce the width of the conductive plug, the etching comprising etching material of the conductive plug containing greater concentrations of dopant at a greater rate than material of the conductive plug containing lower concentrations of dopant.

13. A method of forming DRAM circuitry comprising:

forming insulative material over the node location;

forming a contact opening through the insulative material and exposing a portion of the node location;

forming conductive material within the contact opening the conductive material forming a conductive plug over a substrate node location between a pair of conductive lines and with which electrical communication with a bit line is desired, the conductive plug having a first uppermost surface having a generally uniform surface and having a width;

etching material of the conductive plug to define a second uppermost surface which is generally non-planar and at least a portion of which is disposed elevationally higher than the conductive lines and to reduce the width of the conductive plug; and removing said insulative material prior to etching material of the conductive plug.

14. The method of claim 13 further comprising planarizing the conductive material.

15. The method of claim 13, wherein the forming of the insulative material over the node location comprises forming first and second layers of insulative material over the node location.

16. The method of claim 15 further comprising planarizing the first insulative layer prior to forming the second insulative layer.

17. The method of claim 15, wherein the forming of the second layer of insulative material comprises forming said second layer to have a generally planar surface over the node location, and further comprising after the forming of the conductive material, planarizing said conductive material to be substantially coplanar with the second layer surface.

18. The method of claim 17, wherein the etching of the material of the conductive plug comprises facet etching the conductive plug.

19. The method of claim 17, wherein the etching of the material of the conductive plug comprises:

unevenly doping material of the conductive plug with dopant proximate the uppermost surface, outermost side portions of the plug having greater concentrations of dopant than plug material therebetween; and etching material of the conductive plug containing greater concentrations of dopant at a greater rate than material of the conductive plug containing lower concentrations of dopant.

20. A method of forming DRAM circuitry comprising:

forming a conductive plug over a substrate node location between a pair of conductive lines and with which electrical communication with a bit line is desired, the conductive plug having an uppermost surface which is defined in part by a corner region and having a width;

providing impurity into the corner region; and etching material of the conductive plug containing greater concentrations of the impurity at a greater rate than material of the conductive plug containing lower concentrations of the impurity effective to reduce the width of the conductive plug.

21. The method of claim 20, wherein the providing of the impurity comprises conducting an angled ion implant of the impurity.

22. The method of claim 20, wherein the forming of the conductive plug comprises forming the plug to project away from the node location a distance which is further than a distance one of the conductive lines projects away from the node location.

23. The method of claim 20, wherein the forming of the conductive plug comprises forming the plug's uppermost surface elevationally over both conductive lines.

24. The method of claim 20, wherein the forming of the conductive plug comprises:

forming an insulative material over the node location, at least a portion of the insulative material having a generally planar surface;

forming a contact opening through the insulative material and exposing a portion of the node location;

forming conductive material within the contact opening and over the insulative material; and planarizing the conductive material sufficient to provide the uppermost plug surface to be generally coplanar with the generally planar surface portion of the insulative material.

25. The method of claim 24 further comprising removing the insulative material prior to the etching of the material of the conductive plug.

26. The method of claim 24 further comprising removing the insulative material prior to the providing of the impurity into the corner region.

27. A method of forming DRAM circuitry comprising:

forming a conductive plug over a substrate node location between a pair of conductive lines and with which electrical communication with a bit line is desired, the conductive plug having an uppermost surface; and while the uppermost surface is entirely outwardly exposed, unevenly removing material of the conductive plug to define a second uppermost surface at least a portion of which is disposed elevationally higher than the conductive lines and to reduce a width of the conductive plug from what it was prior to said unevenly removing.

28. The method of claim 27 wherein the removing removes material of the conductive plug from an entirety of the uppermost surface.

29. The method of claim 27 wherein the uppermost surface is substantially planar immediately prior to the unevenly removing.

30. The method of claim 27 wherein the removing removes material of the conductive plug from an entirety of the uppermost surface, and wherein the uppermost surface is substantially planar immediately prior to the unevenly removing.

31. A semiconductor processing method of forming a conductive projection comprising:

providing a substrate having a surface area over which a conductive projection is to be formed;

forming a conductive projection over the surface area, the projection having an upper surface and a side surface joined therewith defining a corner region; and beveling the corner region of the conductive projection, insulative material being received against the side surface at the corner region at the start of the beveling.

32. A semiconductor processing method of forming a conductive projection comprising:

providing a substrate having a surface area over which a conductive projection is to be formed;

forming a conductive projection over the surface area, the projection having an upper surface and a side surface joined therewith defining a corner region;

beveling the corner region of the conductive projection;

wherein the surface area comprises a diffusion region, and further comprising after the beveling of the corner region, forming conductive material over the beveled corner region of the conductive projection and in electrical communication with the diffusion region; and further comprising BPSG being received against the side surface at the corner region at the start of the beveling.

33. A semiconductor processing method of forming a conductive projection comprising:

providing a substrate having a surface area over which a conductive projection is to be formed;

forming a conductive projection over the surface area, the projection having an upper surface and a side surface joined therewith defining a corner region;

beveling the corner region of the conductive projection; and wherein the beveling of the corner region comprises:
unevenly doping material of the conductive projection proximate the upper and side surfaces thereof;
etching material of the conductive projection containing greater concentrations of dopant at a greater rate than material of the conductive projection containing lower concentrations of dopant; and further comprising BPSG being received against the side surface at the corner region at the start of the beveling.

34. A semiconductor processing method of forming a conductive projection comprising:

forming a pair of spaced-apart, insulated conductive lines over a substrate, the conductive lines defining a node location therebetween with which electrical communication is desired;

forming insulative material over the node location and between the conductive lines;

forming an opening through the insulative material and between the lines to proximate the node location;

forming conductive material within the opening over the node location, the conductive material having side surfaces which project away from the node location and terminate proximate an upper surface, the side surfaces and upper surface defining at least one corner region;

beveling the corner region;

further comprising BPSG being received against at least one side surface at the corner region at the start of the beveling; and planarizing said conductive material to be substantially coplanar with the second layer surface.

* * * * *

UNITED STATES PATENT AND TRADEMARK OFFICE
CERTIFICATE OF CORRECTION

PATENT NO.   : 6,309,973 B1
DATED        : October 30, 2001
INVENTOR(S)  : Mark Fischer et al.

It is certified that error appears in the above-identified patent and that said Letters Patent is hereby corrected as shown below:

Column 2,
Line 11, replace "rendering this; portion" with -- rendering this portion --
Line 14, replace "and electrical is components" with -- and electrical components --
Line 36, replace "doped with do" with -- doped with dopant --
Line 37, replace "ad conductive plug" with -- and conductive plug --
Line 63, replace "processing a step" with -- processing step --

Column 3,
Line 24, replace "process irk accordance" with -- process in accordance --
Line 34, replace "comprises a is diffusion" with -- comprises a diffusion --
Line 57, replace "opening; are preferably" with -- openings are preferably --

Column 4,
Line 1, replace "surfaces 74 which joined" with -- surfaces 74 which are joined --

Signed and Sealed this

Twenty-first Day of January, 2003

JAMES E. ROGAN
*Director of the United States Patent and Trademark Office*